(12) United States Patent
Higashi et al.

(10) Patent No.: US 6,678,144 B2
(45) Date of Patent: Jan. 13, 2004

(54) CAPACITOR, CIRCUIT BOARD WITH BUILT-IN CAPACITOR AND METHOD FOR PRODUCING THE SAME

(75) Inventors: Mitsutoshi Higashi, Nagano (JP); Koji Omori, Shiojiri (JP); Takashi Mochizuki, Shiojiri (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 0 days.

(21) Appl. No.: 10/083,788

(22) Filed: Feb. 27, 2002

(65) Prior Publication Data

US 2002/0122283 A1 Sep. 5, 2002

(30) Foreign Application Priority Data

Mar. 1, 2001 (JP) .......................... 2001-057281

(51) Int. Cl.⁷ .............................................. H01G 4/228
(52) U.S. Cl. ............................. 361/306.3; 361/306.1; 361/311; 361/313; 361/321.1; 174/255; 174/256
(58) Field of Search .................... 361/306.3, 306.1, 361/311, 313, 321.1, 305, 309, 320, 321.5; 174/255, 256

(56) References Cited

U.S. PATENT DOCUMENTS

| | | | |
|---|---|---|---|
| 3,898,539 A | | 8/1975 | Yoshimura et al. |
| 4,828,738 A | * | 5/1989 | Tsuchiya et al. |
| 5,035,939 A | | 7/1991 | Conlon et al. |
| 5,142,438 A | | 8/1992 | Reinberg et al. |
| 5,452,178 A | | 9/1995 | Emesh et al. |
| 5,685,968 A | | 11/1997 | Hayakawa et al. |
| 5,687,056 A | * | 11/1997 | Harshe et al. |
| 5,745,334 A | | 4/1998 | Hoffarth et al. |
| 5,807,626 A | | 9/1998 | Naba .......................... 428/210 |
| 5,814,849 A | | 9/1998 | Azuma et al. |
| 5,872,696 A | | 2/1999 | Peters et al. |
| 5,936,831 A | | 8/1999 | Kola et al. |
| 6,017,225 A | * | 1/2000 | Michiya et al. |
| 6,072,689 A | | 6/2000 | Kirlin |
| 6,110,596 A | | 8/2000 | Kasori et al. ................ 428/428 |
| 6,381,119 B1 | * | 4/2002 | Katori |
| 6,410,858 B1 | * | 6/2002 | Sasaki et al. |

FOREIGN PATENT DOCUMENTS

| | | |
|---|---|---|
| JP | 52-137665 | 11/1977 |
| JP | 6-252528 | 9/1994 |
| JP | 08-213755 | * 8/1996 |
| JP | 11-346061 | * 12/1999 |
| TW | 275180 | 5/1996 |
| TW | 314686 | 9/1997 |
| TW | 342577 | 10/1998 |
| TW | 343381 | 10/1998 |
| WO | WO 96/37089 | 11/1996 |

* cited by examiner

Primary Examiner—Dean A. Reichard
Assistant Examiner—Ha Nguyen
(74) Attorney, Agent, or Firm—Paul & Paul

(57) ABSTRACT

A capacitor is formed between a lower wiring layer and an upper wiring layer in an interior of a circuit board. The capacitor is formed of a lower metallic layer which is of at least one valve metal selected from the group consisting of aluminum, tantalum, niobium, tungsten, vanadium, bismuth, titanium, zirconium and hafnium, a dielectric layer which is of an oxide of the valve metal which may be the same as or different from the valve metal of the lower metallic layer, an intermediate layer which is of a solid electrolyte, and an upper metallic layer which is of an electrode metal, laminated in this order.

36 Claims, 6 Drawing Sheets

CAPACITOR, CIRCUIT BOARD WITH BUILT-IN CAPACITOR AND METHOD FOR PRODUCING THE SAME

BACKGROUND OF THE INVENTION

1. Field of the Invention

The present invention relates to a capacitor, a circuit board with a built-in capacitor wherein a capacitor is incorporated in the interior of the circuit board, and a method for producing such a capacitor and a circuit board with a built-in capacitor.

2. Description of the Related Art

As is well known, there are semiconductor packages which require built-in capacitor components. To satisfy this requirement, a capacitor component is generally mounted as a chip onto an uppermost layer of the semiconductor package or to incorporate the capacitor element in a printed circuit board. For example, Japanese Unexamined Patent Publication (Kokai) No. 6-252528 discloses a printed board carrying thereon a film-like capacitor element as shown in FIG. 1. A printed board 101 has a wiring layer 102 of copper (Cu), a metallic layer (a lower electrode) 104 of gold (Au) which is difficult to anodize, a metal oxide dielectric film 106 formed upon anodization of aluminum which is a metal capable of being easily anodized, and a metallic layer (an upper electrode) 107 formed of Au which is the same as the lower electrode or Cu sequentially formed thereon. The respective layer or film can be formed at a predetermined thickness, for example, by a conventional film-forming method, such as plating, vacuum deposition, sputtering or chemical vapor deposition (CVD). In such a laminated structure, an aluminum type film capacitor element is formed from Au film (a lower electrode) 104, $Al_2O_5$ film (a dielectric film) 106 and Au film (an upper electrode) 107. Note that if Ta is used in place of Al, a Ta type film capacitor element can be obtained.

Many problems, however, are still unsolved in the prior art capacitor components, including in the film capacitor element described above with reference to FIG. 1. For instance, when the capacitor component is mounted onto the semiconductor package, as a surface area in the outermost layer of the package is restricted, there is a limit in the number of parts which can be mounted. Also, since a distance from a semiconductor chip to the capacitor component (a wiring distance) is increased, a size of the semiconductor package, which must essentially be small, becomes large. In addition, in such a semiconductor package, due to the rerouted wiring of a circuit, a capacitance (electrostatic capacity) increases to disturb a high speed response. Recently, as the miniaturization and the high density integration of the semiconductor package has become more important, the above problems are now serious, In the conventionally applied element structures wherein the upper electrode is formed directly on the dielectric film formed on the lower electrode, there is a problem that an electrostatic capacity in the resultant capacitor component becomes lower which in turn increases a leakage current. While a thickness of the dielectric film could be increased to reduce the leakage current, such a countermeasure cannot solve the problem of reduction in the electrostatic capacity and also it causes reduction in the yield of the production.

SUMMARY OF THE INVENTION

The present invention is directed to solve the above-mentioned problems in the prior art.

One object of the present invention is to provide a capacitor component capable of being mounted onto a semiconductor package without restricting the number of the mounted capacitor components and capable of reducing a distance between a semiconductor chip and the capacitor component so that the miniaturization and the high density integration of the semiconductor package are largely facilitated.

Another object of the present invention is to provide a high performance capacitor component showing a larger electrostatic capacity, higher pressure resistance and less leakage current.

A further object of the present invention is to provide a capacitor component having a high reliability and good production yield.

A further object of the present invention is to provide a small-sized and high-performance circuit board, having the capacitor component, in accordance with the present invention, incorporated therein.

A further object of the present invention is to provide a method of producing the capacitor component and the circuit board with a built-in capacitor according to the present invention in a simple manner and at a high yield.

The above-mentioned objects and other objects of the present invention will be more easily understood from the following detailed description regarding to the preferred embodiments and examples of the present invention.

In one aspect, the present invention resides in a capacitor used while being incorporated in an interior of a circuit board between lower and upper wiring layers, comprising a lower metallic layer formed of at least one valve metal, i.e., valve-acting metal, selected from the group consisting of aluminum, tantalum, niobium, tungsten, vanadium, bismuth, titanium, zirconium and hafnium, a dielectric layer formed of an oxide of the valve metal which may be the same as or different from that of the lower metallic layer, an intermediate layer formed of a solid electrolyte, and an upper metallic layer formed of an electrode metal, layers in the capacitor being laminated in this order.

In another aspect thereof, the present invention resides in a circuit board with a built-in capacitor wherein the capacitor according to the present invention is incorporated in an interior of the circuit board between lower and upper electrode layers.

In a further aspect thereof, the present invention resides in a method of producing a capacitor used while being incorporated in an interior of a circuit board between lower and upper wiring layers, comprising the steps of, after forming the lower wiring layer:

forming on the lower wiring layer a lower metallic layer from at least one valve metal selected from the group consisting of aluminum, tantalum, niobium, tungsten, vanadium, bismuth, titanium, zirconium and hafnium;

forming on the lower metallic layer a dielectric layer from an oxide of the valve metal which may be the same as or different from that of the lower metallic layer;

forming on the dielectric layer an intermediate layer from a solid electrolyte selected from the group consisting of a conductive polymer, organic semiconductor material and conductive metal oxide; and forming on the intermediate layer an upper metallic layer from an electrode metal.

In a still further aspect thereof, the present invention resides in a method of producing a circuit board with a built-in capacitor wherein a capacitor is incorporated in an interior of the circuit board between lower and upper layers, comprising the steps of:

after forming on a core substrate the lower wiring layer from a conductive metal, forming on the lower wiring layer a lower metallic layer from at least one valve metal selected from the group consisting of aluminum, tantalum, niobium, tungsten, vanadium, bismuth, titanium, zirconium and hafnium;

forming on the lower metallic layer a dielectric layer from an oxide of the valve metal which may be the same as or different from that of the lower metallic layer;

forming on the dielectric layer an intermediate layer from a solid electrolyte selected from the group consisting of a conductive polymer, organic semiconductor material and conductive metallic oxide;

forming on the intermediate layer an upper metallic layer from an electrode metal and, further forming the upper wiring lower from a conductive metal on the capacitor thus formed.

In this producing method, after forming the first capacitor on the core substrate, an insulation film covering the first capacitor and then a second capacitor on the insulation film may be formed in the same manner as forming the first capacitor. Similarly, a third, a fourth, etc. capacitors may be formed in the same manner,

DESCRIPTION OF THE PREFERRED EMBODIMENTS

Figure 1:
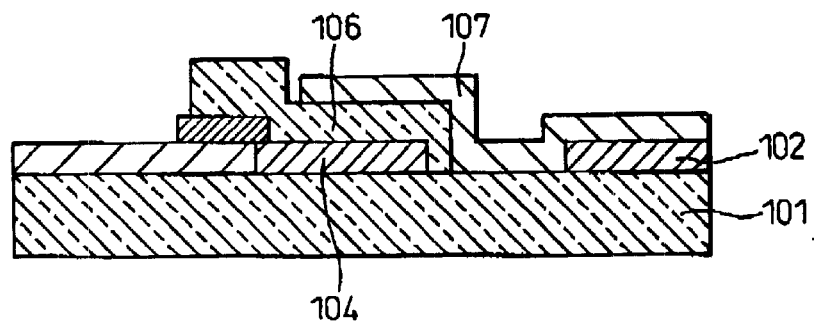
FIG. 1 is a sectional view illustrating one example of the prior art capacitor element.

Although the capacitor according to the present invention may be used while being mounted on a circuit board, if necessary, it is usually used while being built into the interior of the circuit board. Also, one capacitor may be built into the interior of the circuit board, but preferably two or more capacitors may be built into a desired arrangement pattern in the interior of the circuit board. Further, in the circuit board, the respective capacitors are generally used while being sandwiched between a lower wiring layer and an upper wiring layer. In this regard, it should be noted that the term "circuit board" used in this specification has a meaning generally understood in the electronics field. That is, the circuit board is a wiring board carrying semiconductor components, circuit components and other functional components thereon and connecting them with each other by wires. Also, the circuit board includes a laminated substrate such as a multilayered circuit board having a built-up structure as described below.

The capacitor according to the present invention has a basic structure generally used in the prior art capacitor, and thus a dielectric layer is interposed between upper and lower conductive metallic layers; i.e., upper and lower electrodes. The capacitor according to the present invention, however, is characterized in that it comprises (1) a lower metallic layer functioning as a lower electrode, formed of at least one valve metal, (2) a dielectric layer formed of an oxide of the valve metal which may be the same as or different from that of the lower metallic layer, (3) an intermediate layer formed of a solid electrolyte, and (4) an upper metallic layer formed of an electrode metal, the layers being laminated in the above order.

As described above, the lower metallic layer functioning as a lower electrode is formed from at least one valve metal as described above. The valve metal is a metal which does not require a heat treatment at an elevated temperature; in other words, a metal having a valve function. Preferably, the valve metal includes, for example, aluminum (Al), tantalum (Ta), niobium (Nb), tungsten (W), vanadium (V), bismuth (Bi), titanium (Ti), zirconium (Zr), hafnium (Hf) and others. Such a valve metal may be used either alone or in combination with two or more of them, or in some cases, may be used in a compound form. A nitride (such as TiN or TaN) is a suitable compound. Of such a number of valve metals or compounds thereof, Ta and Nb are particularly advantageous in the practice of the present invention, because a layer thereof can be in tight contact with a core substrate or other underlying layers. Alternatively, the lower metallic layer may not be formed of the above-mentioned valve metal or compounds thereof, and in such a case, it may be formed from a mixture of compounds of different valve metals, a mixture of valve metal compound and valve metal, a mixture of valve metal compound and other compound, or an valve metal alloy. The valve metal alloy includes, for example, TiW and others.

The lower metallic layer may be formed to have a desired film thickness by using a conventional film-forming technique used for the production of semiconductor device and others. Suitable film-forming methods include, for example, vacuum deposition, sputtering and CVD. Film-forming conditions such as pressure, temperature and others may be optionally varied in accordance with the desired effect or thickness. While the lower metallic layer is usually used as a single layer, it may be of two or more multilayered structure if necessary. While a film thickness of the lower metallic layer may be widely varied as in the film-forming conditions, the thickness is usually 2 $\mu$m or more, preferably in a range from about 2 to 5 $\mu$m, more preferably from about 2 to 3 $\mu$m. A larger film thickness should be avoided, because it contradicts the recent trend to reduce a capacitor thickness, and this is also true of the other layers of the capacitor. Contrarily, if the film thickness of the lower metallic layer is less than 2 $\mu$m, a sufficient performance of the capacitor is not obtainable.

In the capacitor of the present invention, a tight-contacting layer may be provided, if necessary, between the lower metallic layer and the underlying wiring layer, generally a copper-based wiring layer, to facilitate the bonding strength between these layers. The tight-contacting layer is suitably a Cr layer, for example.

On the lower metallic layer, a dielectric layer is laminated which is made of an oxide of the valve metal which may be the same as or different from the used for the formation of the lower metallic layer. To simplify the formation process of the dielectric layer, the lower metallic layer and the overlying dielectric layer are favorably formed from the same valve metal, because the dielectric layer can be easily formed upon oxidation, preferably anodizing, of the underlying lower metallic layer. The anodizing process may preferably carried out by a constant current and constant voltage method. The dielectric layer can preferably be formed from an oxide of valve metal such as Ta or Nb. Alternatively, the dielectric layer may be formed from a suitable film-forming material selected as a starting material wherein the material or a reaction product thereof is deposited as a film form to the lower metallic layer. Vacuum deposition, sputtering and CVD method are included as a favorable film-forming technique.

For instance, if the lower metallic layer is formed of Ta, the dielectric layer to be disposed thereon can be advantageously formed by the anodizing process of the underlying Ta layer. The anodizing process can be carried out by using an anodizing apparatus generally used in this technical field. Electrolyte may be, for example, an aqueous solution of 0.01 to 1.0% by weight of ammonium phosphate or citrate. An anode and a cathode connected to a direct current source are immersed in the electrolyte. For example, a substrate having anodized metal oxide is used as an anode and a platinum (Pt) mesh is used as a cathode. In accordance with the constant current and constant voltage method, the oxidation process is commenced. When a target voltage has been reached after a reaction time has passed, a constant current mode is changed to a constant voltage mode, and the oxidation process further continues. The oxidation process continues until the current decreases to lower than a predetermined value. In this regard, to prevent the lower wiring layer, which should not, essentially, be anodized, from being in contact with the electrolyte, thereby being anodized, the under-wiring layer is preferably protected by a resist material or the like. As a result of the anodizing described above, a surface of the Ta layer is oxidized to a certain depth to form the dielectric layer consisting of tantalum pentoxide $Ta_2O_5$.

The film thickness of the dielectric layer may be varied in a wide range in accordance with film-forming conditions and/or desired effects thereof. Since a film-forming rate is 16 and 24 Å per volt in the dielectric layers derived from Ta and Nb, respectively, an optimum film thickness can be determined by multiplying the same by a voltage (V). This is because an electrostatic capacity is determined by the following equation:

Electrostatic capacity $C=\epsilon S/d$ wherein $\epsilon$ is a dielectric constant of the capacitor, S is a surface area of the dielectric layer and d is a film thickness of the dielectric layer.

The capacitor of the present invention has an interposed intermediate layer consisting of a solid electrolyte between the above-mentioned dielectric layer and an upper metallic layer which will be described below. Various kinds of solid electrolyte may be used for forming the intermediate layer so long as the expected purpose for reducing a film thickness of the dielectric layer is achievable. Particularly, the solid electrolyte material exhibiting a conductance of $10^2$ siemens (S) or more is advantageously usable. In view of the film-forming property, availability and others, suitable solid electrolytes include a conductive polymer, an organic semiconductor material and a conductive metal oxide. For example, the conductive organic polymer includes polypyrrol, polythiophene, polyaniline and others, although not limited thereto. The organic semiconductor material includes TCNQ complex and others, although not limited thereto. Further, the conductive metal oxide includes tin oxide, lead oxide or manganese oxide although not limited thereto.

The intermediate layer made of a solid electrolyte may be used in a single layer structure or in a multilayered structure consisting of two or more layers. The intermediate layer may be formed to have any optional film thickness from the solid electrolyte material used for the formation thereof by a conventional film-forming method. For example, the intermediate layer of the conductive polymer may be formed by a wet process such as a chemical polymerization, electrolytic polymerization or the combination thereof. On the other hand, the intermediate layer of the organic semiconductor material may be formed by a dry process such as a vacuum deposition, sputtering or CVD. The formation of the intermediate layer from the conductive metal oxide may be carried out in a similar manner. While the film thickness of the intermediate layer may be varied in a wide range, it is preferably in a range from about 1 μm to about 5 μm, more preferably from about 1 μm to 3 μm. The provision of the intermediate layer facilitates a reduction in leakage current, an increase in electrostatic capacity and an improvement in pressure resistance of the capacitor.

An upper metallic layer of a conductive electrode metal is laminated as an upper electrode on the intermediate layer of solid electrolyte to thereby complete the capacitor. Suitable electrode metals include Au, Cu and others, although not limited thereto. However, Au and Cu are particularly advantageously used.

The upper metallic layer may be formed from the above-mentioned electrode metal at a desired film thickness by a conventional film-forming technique used in the production of a semiconductor device. Suitable film-forming methods include, for example, a vacuum deposition, sputtering, CVD or others. Film-forming conditions such as pressure or temperature may be optionally varied in accordance with the desired effects or film thicknesses. The upper metallic layer may be used in a single layer structure or in a multilayered structure consisting of two or more layers. While the film thickness of the upper metallic layer may be varied in a wide range as in the film-forming conditions in accordance with the desired effects, it is usually 2 μm or more, preferably in a range from about 2 μm to 5 μm, more preferably from about 2 μm to 3 μm. A larger film thickness should be avoided because it contradicts the recent trend to reduce the capacitor thickness. Contrarily, if the film thickness of the upper metallic layer is less than 2 μm, a sufficient performance of the capacitor is not obtainable. Further, prior to forming the upper metallic layer, a tight-contact layer such as Cr, Ni or others may be provided for enhancing the bonding strength of the upper metallic layer with the underlying layer (intermediate layer of solid electrolyte).

More concretely, the upper metallic layer can be advantageously formed by depositing an electrode metal such as Au or Cu at 2 to 3 μm thickness through a sputtering method after a thin film of Cr, Ni, Ni—Cr or the like has been formed.

After the formation of the capacitor through a series of processes described above, to obtain a capacitor built-in structure in an interior of the substrate, the capacitor is followed by the ordinary treatments such as sealing with an insulation film, formation of a wiring layer or connection between the wiring layer and the capacitor.

In the capacitor of the present invention, the lower wiring layer preferably has a topographic pattern consisting of fine projections and fine pits on a surface thereof. The topographic pattern of the lower wiring layer is sequentially transferred to, and reproduced in, the lower metallic layer and then to the dielectric layer formed thereon to thereby result in an increase of a surface area of the capacitor electrode, whereby it becomes possible to increase the electrostatic capacity. Also, the larger the capacity, the greater the improvement in the high-frequency characteristics. Particularly, in the capacitor of the present invention, it is remarkably noted that an excellent impedance characteristic can be obtained which is comparable to that of the conventional film capacitor, although the capacitor is extremely thin and further it is incorporated in the substrate. Further, if the topographic pattern is provided on a surface of the dielectric layer, it becomes possible to easily carry out a process for forming the intermediate layer firmly bonded to the dielectric layer by depositing a solid electrolyte thereon.

In the capacitor of the present invention, the topographic pattern is generally formed directly on the lower wiring layer by treating the wiring layer itself. However, alternatively, it is also possible to apply the topographic pattern to the underlying core substrate or the like, thereby transferring the pattern to the wiring layer in the subsequent film-forming process for forming the wiring layer. Also, if possible, the topographic pattern may be applied directly to the lower metallic layer or the dielectric layer to increase the electrostatic capacity to a desired level. In this regard, it should be noted that since the transfer of the topographic pattern usually stops after its transfer to the dielectric layer, no topographic pattern will appear on a surface of the intermediate layer of the solid electrolyte and the upper metallic layer.

Various patterns and depths may be applied to the formation of the topographic pattern on the surface of the lower wiring layer. For example, the topographic pattern may be that in which projection and pit portions are randomly distributed or that in which projection and pit portions are regularly distributed to form a chessboard-like appearance. As an example of the latter, saw teeth-like or trapezoidal projections are continuously distributed to form a topographic pattern. In particular, a plurality of parallel grooves are formed in the vertical and horizontal directions on the lower wiring layer to form a pattern consisting of the combination of densely arranged projection and pit portions.

In addition to the variety of patterns, a depth of the topographic pattern in the respective layer from the lower wiring layer to the dielectric layer may be varied in a wide range depending upon the desired effects. For example, a surface roughness of the topographic pattern on the lower metallic layer, determined by a vertical distance between a top of the projection portion and a bottom of the pit portion, is preferably in a range from 5 to 50 $\mu$m. If the surface toughness of the topographic pattern in the lower metallic layer is less than 5 $\mu$m, a desired topographic pattern sufficient for increasing the electrostatic capacity is not obtained in the dielectric layer. Contrarily, if exceeding 50 $\mu$m, the bonding strength between the adjacent layers may be lowered.

The topographic pattern may advantageously be applied to the lower wiring layer and, if necessary, to others, by using any method conventionally used in the field for producing a semiconductor device or a magnetic recording medium. That is, the well-known methods such as a surface roughening method or a texturing method may be used for the application of topographic pattern. For example, a surface to be processed may be etched to a desired depth by using laser fabrication or otherwise lapped with an abrasive tape and the like.

The present invention also resides in a circuit board in which the capacitor of the present invention described above is incorporated. That is, the capacitor built-in circuit board according to the present invention is characterized in that at least one capacitor is incorporated in an interior of the circuit board between lower and upper wiring layers; the capacitor comprising a lower metallic layer formed of at least one valve metal selected from the group consisting of aluminum, tantalum, niobium, tungsten, vanadium, bismuth, titanium, zirconium and hafnium, a dielectric layer formed of an oxide of the valve metal which may be the same as or different from that of the lower metallic layer, an intermediate metallic layer formed of a solid electrolyte, and an upper metallic layer formed of an electrode metal, the layers being laminated in this order.

The circuit board with a built-in capacitor according to the present invention may have any of various configurations known in this technical field. One useful circuit board with a built-in capacitor is a multilayered circuit board having a built-up structure. While the capacitor of the present invention may be formed at an optional position within the circuit board, it is preferred that the capacitor is incorporated in the vicinity of a semiconductor chip to be mounted. According to such an arrangement, wiring resistance is suppressed and frequency characteristics are improved.

Any of the circuit boards with a built-in capacitor of the present invention is thin and compact. In spite of such a structure, capacitors or other functional elements can be further incorporated at a high density. Particularly, according to the present invention, there is a merit in that a capacitor having a necessary capacity can be formed at a desired position in the circuit board at any time in the fabrication of the circuit board.

The circuit board with a built-in capacitor of the present invention is based on a base (also called as a core substrate). The base used for the circuit board is generally formed from an insulating material conventionally used for the production of a circuit board, including an organic material (resinous material), ceramic material, silicon, glass or a metallic material. For example, suitable resinous material includes an epoxy resin and polyphenylene ether resin. The base may be used as it is or after being surface-treated for the purpose of improving the processiblity and the capacitor characteristic. Also, to simplify the formation of the wiring layer, the surface of the base may be coated with a conductive metal. Such a coated base is, for example, a copper-clad laminated resinous substrate which is commercially readily available.

The upper and bottom wiring layers may be formed by using various conductive metals and variety of techniques conventionally used for the production of the circuit board. A thickness of the wiring layer is generally in a range from about 5 $\mu$m to about 25 $\mu$m. For example, a Cu layer is deposited to have a thickness of 0.5 $\mu$m by a sputtering method, and then a thicker Cu layer having a thickness of 10 $\mu$m is deposited thereon by electroplating to obtain a Cu wiring layer.

According to the present invention, methods for producing the capacitor and the circuit board with a built-in capacitor, both described above, are also provided.

In one aspect thereof, the present invention resides in a method for producing a capacitor used while being incorporated in an interior of a circuit board between lower and upper wiring layers, comprising the steps of:

after forming the lower wiring layer, forming on the lower wiring layer a lower metallic layer from at least one valve metal selected from the group consisting of aluminum, tantalum, niobium, tungsten, vanadium, bismuth, titanium, zirconium and hafnium;

forming on the lower metallic layer a dielectric layer from an oxide of the valve metal which may be the same as or different from that of the lower metallic layer;

forming on the dielectric layer an intermediate layer from a solid electrolyte selected from the group consisting of a conductive polymer, organic semiconductor material and conductive metallic oxide; and forming on the intermediate layer an upper metallic layer from an electrode metal.

In the method of the present invention, a predetermined topographic pattern is preferably applied to the lower wiring layer, as described before. That is, after the lower wiring layer has been formed on the core substrate, a surface of the wiring layer is preferably roughened to provide a topographic pattern to be transferred further to the lower metallic layer and the dielectric layer subsequently formed thereon. In this case, a surface roughness of the topographic pattern on the lower metallic layer is preferably controlled to be in a range from 5 to 50 $\mu$m as defined by a vertical distance between a top of the projection portion to a bottom of the pit portion. Of course, as described before, the topographic pattern may be formed in accordance with any alternative method.

According to the present invention, a method for producing a circuit board with a built-in capacitor is also provided, wherein the capacitor is incorporated in an interior of the circuit board in such a manner that the capacitor is sandwiched between lower and upper wiring layers. The production method comprises the steps of:

after forming on a core substrate the lower wiring layer from a conductive metal, forming the capacitor of the present invention in accordance with the production process of the present invention; and further forming, on the capacitor, the upper wiring layer from a conductive metal.

The method for producing the capacitor and the method for producing the circuit board with a built-in capacitor according to the present invention will be easily understood from the detailed above description concerning the capacitor and the following explanation of the preferred embodiments with reference to the accompanying drawings.

Further, as can be appreciated from the following description, using the production method of the present invention, it becomes possible to easily incorporate high-performance capacitors at a high density into the substrate during any desired stage of the fabrication of the substrate, and thus to provide a circuit board with a built-in capacitor capable of contributing to the recent trend to reduce a semiconductor thickness and size. Furthermore, since the incorporation of the capacitor becomes easy and accurate, the production yield which is at most 40 to 50% in the conventional production process can be improved to 90% or more. In addition, according to the production method of the present invention, it becomes possible to produce a circuit board with a built-in capacitor while using the conventional substrate producing apparatus, and thus to reduce the production cost.

It should be noted in this specification that the capacitor of the present invention is described with reference to its use in a circuit board, however, it may be applicable to other various applications without departing from a spirit and scope of the present invention.

The preferred embodiments of the present invention will be further described below with reference to the accompanying drawings. In this regard, it should be noted that the present invention is not limited to the following embodiments.

Figure 2:
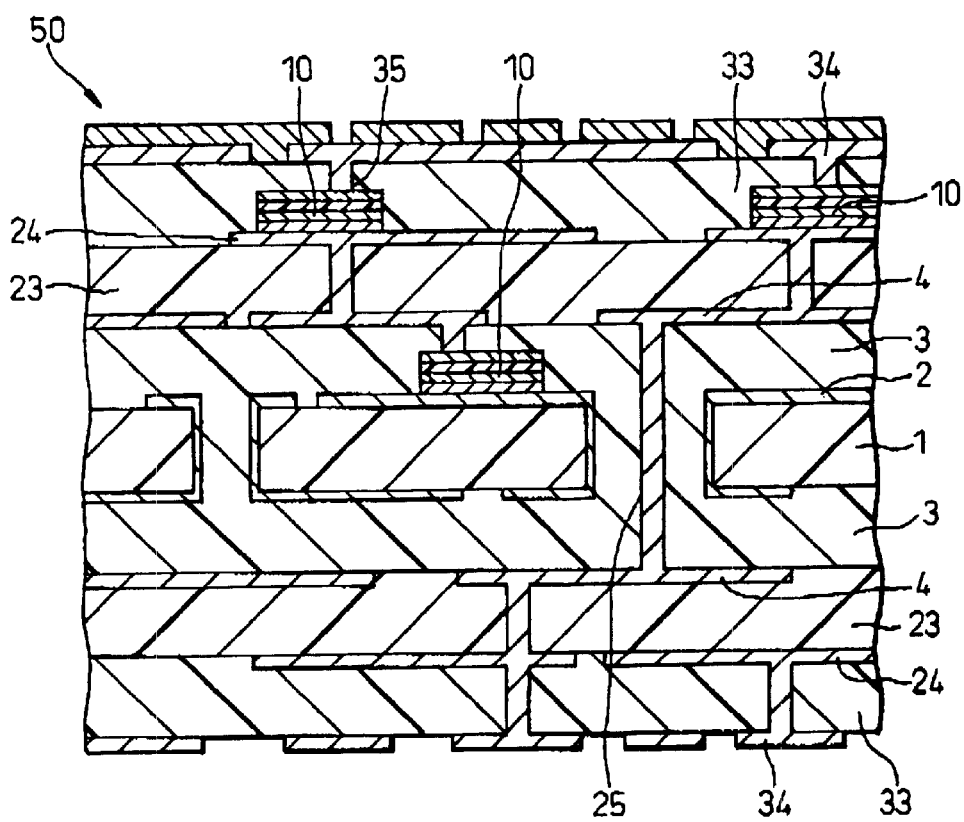
FIG. 2 is a sectional view illustrating one preferred embodiment of a circuit board with a built-in capacitor having a built-up structure according to the present invention.

FIG. 2 is a sectional view of one preferred embodiment of the circuit board with a built-in capacitor having a built-up structure according to the present invention. The built-up circuit board has a conventional printed circuit board as a basic constituent element, however, it is characterized in that each wiring layer is densely formed in a surface portion thereof via an insulation film.

The illustrated built-up circuit board 50 has a plurality of circuit layers 2, 4, 24 and 34 on upper and lower surfaces, respectively, of a core substrate 1. The respective circuit layers are separated from each other via an insulation films 3, 23 or 33. The built-up circuit board 50, in total, has three capacitors 10 above the core substrate 1. Note, however, in the drawing that, although three capacitors 10 are arranged as an example, the number of capacitors may be optionally varied in conformity with the layer structure and other factors of the circuit board 50, or one or more capacitors may of course be arranged below the core substrate 1. The capacitors and the wiring layers, as shown, are connected to each other via a conductive metal filled in the through-holes or vias formed in the core substrate or the insulation film. Further, in the drawing, lamination of the simply-structured high-density circuit layers (built-up layers) on the core substrate 1 is illustrated so that the present invention can be easily understood referring to the built-up circuit board 50 illustrated, however, high-density circuit layers of different lamination structures may, of course, be provided in the practice of the present invention.

Figure 4:
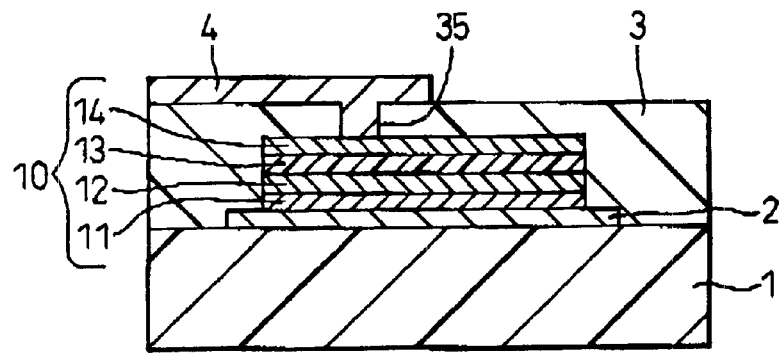
FIG. 4 is a sectional view illustrating one preferred embodiment of the capacitor according to the present invention.
Figure 5:
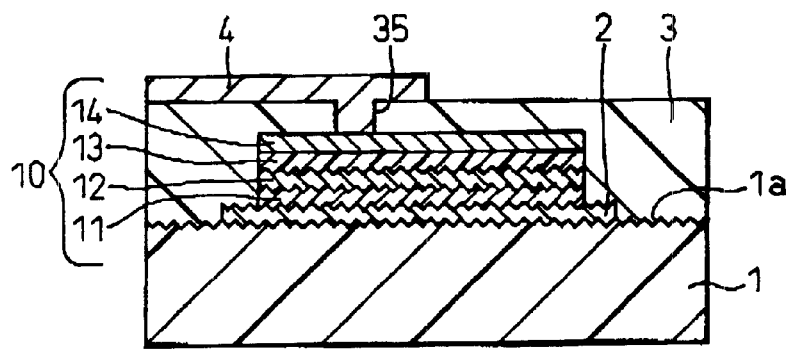
FIG. 5 is a sectional view illustrating another preferred embodiment of the capacitor according to the present invention.
Figure 6:
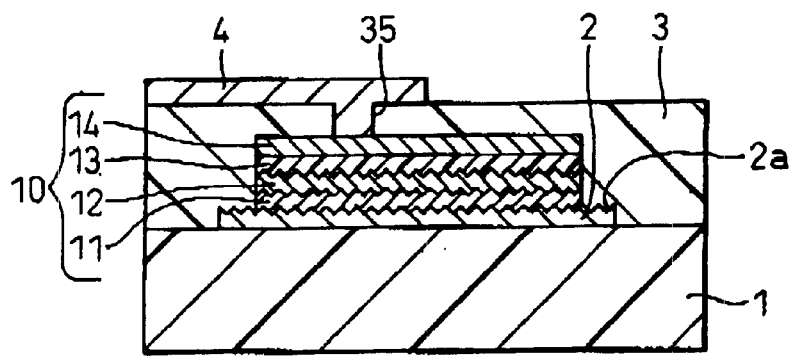
FIG. 6 is a sectional view illustrating a further preferred embodiment of the capacitor according to the present invention.

The capacitor 10 may have any of the structures shown in FIGS. 4 to 6.

In the capacitor 10 shown in FIGS. 4, a wiring layer 2 (in this embodiment, a 10 $\mu$m thick Cu film is plated and patterned) is provided at a predetermined pattern on the core substrate 1 of silicon. The capacitor 10 is formed on this Cu wiring layer 2 by subsequently laminated the following layers in the described order in such a manner that a lower metallic layer 11 is provided as a lower electrode (in this embodiment, a Ta layer of 2 $\mu$m thick is formed by the vacuum-deposition), a dielectric layer 12 (in this embodiment, a $Ta_2O_5$ layer of 25 Å thick is formed by the anodizing of Ta), an intermediate layer 13 of solid electrolyte (in this embodiment, a conductive polymer layer of 2 $\mu$m thick is formed by the polymer coating and heat decomposition of conductive polymer, polypyrrol) and an upper metallic layer 14 as an upper electrode (in this embodiment, a 2 $\mu$m thick Cr/Cu layer is formed by the sputtering method). According to the capacitor 10, as the intermediate layer 13 of solid electrolyte is disposed on the dielectric layer 12, it becomes possible to improve the pressure resistance as well as to reduce a thickness of the dielectric layer 12 whereby a leakage current can be reduced to a great extent. In fact, the leakage current can be reduced to approximately 1/10 to 1/100 of that in the conventional thin-film type capacitor. The circumference of the capacitor 10 is sealed with an insulation film 3 of insulating resin (also referred to as an interlayer insulation film). Although the insulating resin used in this embodiment is an epoxy resin, other resins such as polyimide resin and others may be used. Further, the capacitor 10 is connected to the upper wiring layer 4 (in this embodiment, a plated and patterned Cu film of 10 $\mu$m thick) through a via 35, filled with the conductive metal provided at a predetermined position of the insulation film 3.

Capacitors 10 shown in FIGS. 5 and 6 are each a modification of the capacitor 10 of FIG. 4. In each of these capacitors 10, since a topographic pattern is applied to the dielectric layer 12 thereof according to the present invention, an area of a capacitor electrode is increased to significantly enhance the electrostatic capacity.

Referring to FIG. 5, the core substrate 1 of silicon has a topographic pattern 1a on a surface thereof. The topographic pattern 1a can be formed by various techniques. In the illustrated embodiments, since the core substrate 1 is made of silicon, a laser etching can be preferably used. While the topographic pattern 1a is applied to a full surface of the core substrate 1, it may be applied, if necessary, to only a capacitor-forming area on the surface of the core substrate 1. The topographic pattern 1a of the core substrate 1 can be transferred to the respective layers during the production process of the capacitor 10. That is, after being transferred as a topographic pattern 2a to a surface of the lower wiring layer 2, the topographic pattern 1a is sequentially transferred to a surface of the lower metallic layer 11 and that of the dielectric layer 12. Thereafter, the intermediate layer 13 consisting of solid electrolyte is formed on the dielectric layer 12. However, at this stage, the topographic pattern on the surface of the dielectric layer 12 is not substantially reproduced on a surface of the resulting intermediate layer 13. That is, the surface of the intermediate layer 13 is substantially smooth. Accordingly, the surface of the upper metallic layer 14 formed as the uppermost layer is also substantially smooth.

FIG. 6 shows one modification of the capacitor 10 illustrated in FIG. 5. In the illustrated capacitor 10, the surface of the core substrate 1 remains flat, but the surface of the lower wiring layer 2 formed thereon is imparted with a topographic pattern 2a. The topographic pattern 2a may also be advantageously applied to the surface of the wiring layer 2 by laser etching, or the like, as described with reference to the above-mentioned core substrate. The transfer process of the topographic pattern 2a thus formed is the same as described above. That is, the topographic pattern 2a is sequentially transferred to the surface of the lower metallic layer 11 and further to the surface of the dielectric layer 12. The topographic pattern 2a, however, is not transferred to the surface of the intermediate layer 13 subsequently formed thereon on to the surface of the upper metallic layer 14 thereon.

Referring again to FIG. 2, the capacitor built-in circuit board 50 illustrated is advantageously produced by the steps sequentially shown in FIGS. 3A to 3F. In this embodiment, an epoxy resin substrate is used as a core substrate, instead of a silicon substrate.

Figure 3A:
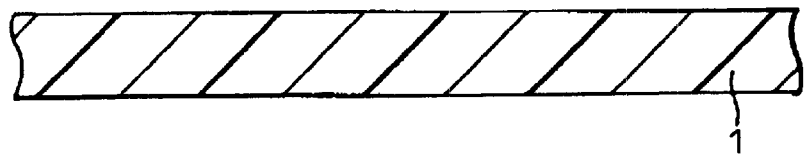
FIGS. 3A to 3F are sectional views sequentially illustrating a method for producing the circuit board shown in FIG. 2.

As shown in the step of FIG. 3A, a core substrate 1 of epoxy resin is first prepared. Although not illustrated, at least a capacitor-forming area on the surface of the core substrate 1 is preferably imparted with a predetermined topographic pattern as described before and also explained hereinafter. While the surface of the core substrate has no coating, copper foils may be press-bonded on opposite sides of the core substrate, if necessary, for forming the circuit layer or otherwise a copper-clad epoxy resin may be prepared.

Figure 3B:
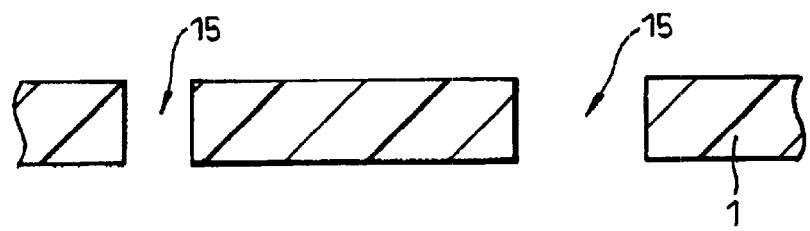

Then, as shown in the step of FIG. 3B, through-holes 15 are bored at predetermined positions on the core substrate 1. The through-hole 15 can be formed finely and precisely by, for example, laser fabrication.

Figure 3C:
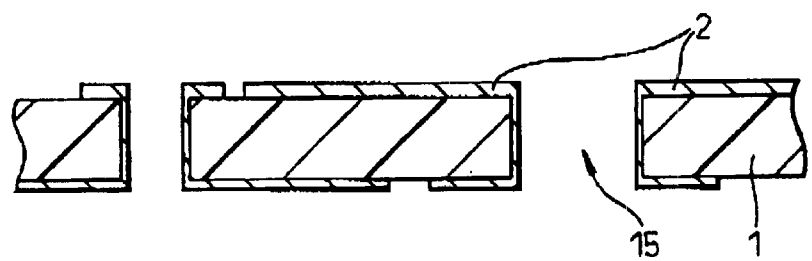

Subsequent to the formation of the through-hole 15, the core substrate are plated with copper by an electroless plating or an electrolytic plating and the copper layer thus formed is patterned so that unnecessary portions thereof are removed. As a result, the core substrate 1 having a copper wiring layer 2 is obtained as shown in the step of FIG. 3C. The copper wiring layer 2 is the lower wiring layer referred to in the present invention.

Figure 3D:
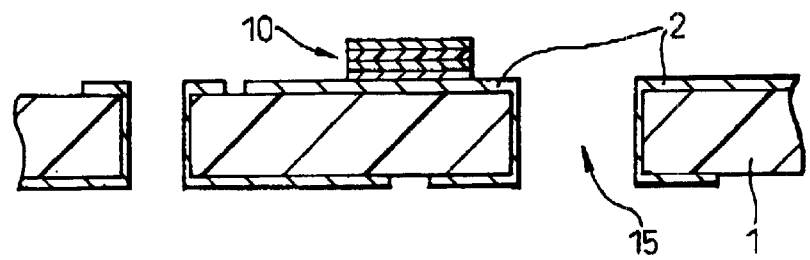

After the copper wiring layer 2 is completed, the capacitor 10 of the present invention is formed as shown in the step of FIG. 3D. As described below with reference to FIGS. 7A to 7I, after the lower electrode has been formed by depositing Ta through a sputtering method, a Ta layer is subjected to an anodizing to form an anodized film ($Ta_2O_5$ layer) as a dielectric layer. Next, the intermediate layer consisting of a solid electrolyte is formed on the dielectric layer by an electrolytic polymerization of the conductive polymer. Finally, an upper electrode is formed by depositing Au on the intermediate layer through a sputtering method.

Figure 3E:
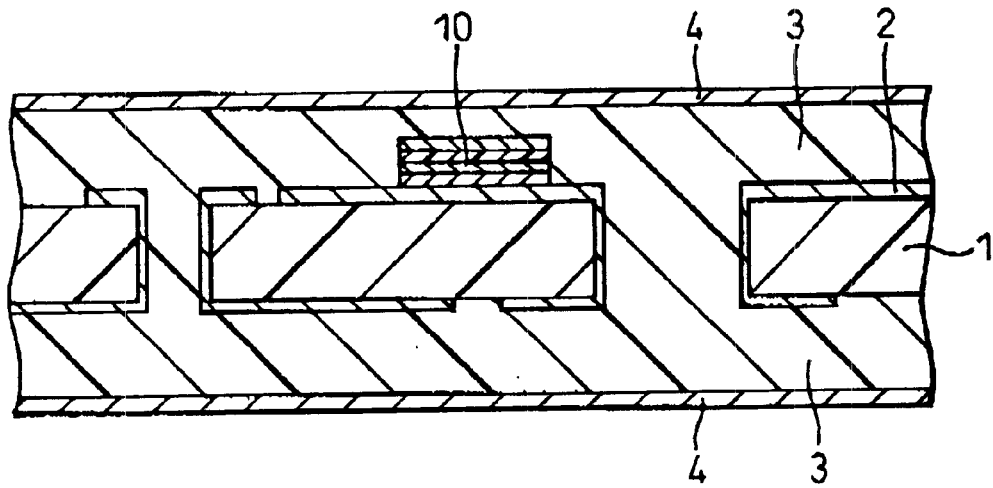

After the capacitor 10 has been completed, as shown in the step of FIG. 3E, a resin film (an insulation film) 3, provided with a conductive layer 4 of copper foil on one surface thereof, is prepared. The core substrate 1 is sandwiched between two sheets of the insulation film 3. Also, the through-holes of the core substrate 1 are filled with the insulation film 3.

Figure 3F:
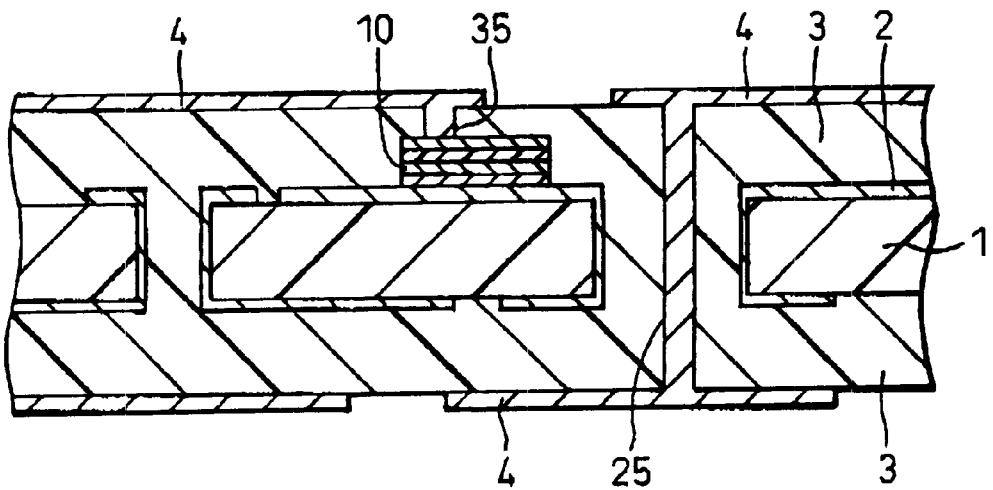

Subsequently, a process for ensuring the conductivity of the capacitor 10 is carried out. As shown in the step of FIG. 3F, the original through-hole now filled with the insulation film 3 is again bored and filled with a conductive material (Cu) 25 by copper plating. Similarly, a via is bored above the capacitor 10 and filled with a conductive material (Cu) 35 by copper plating. The via may be formed by using a conventional technique such as laser fabrication. Thereafter, a copper wiring layer 4 is formed by the patterning of the copper-plated conductive layer.

As described above, the thin type capacitor built-in circuit board having a simple structure can be produced. By repeating the above-mentioned steps of FIGS. 3D to 3F, the capacitor built-in circuit board 50 shown in FIG. 2 can be produced although an explanation of the individual steps is eliminated herein to avoid duplication.

More specifically, capacitors 10 shown in FIG. 3D and FIG. 5 can be advantageously produced in accordance with the processes shown in FIGS. 7A to 7I.

Figure 7A:
FIGS. 7A to 7I are sectional views sequentially illustrating a method for producing the capacitor shown in FIG. 5.

First, as shown in the step of FIG. 7A, a core substrate 1 of epoxy resin is prepared. The core substrate 1 may be formed of different resin, or alternatively, of silicon, a ceramic or glass.

Figure 7B:
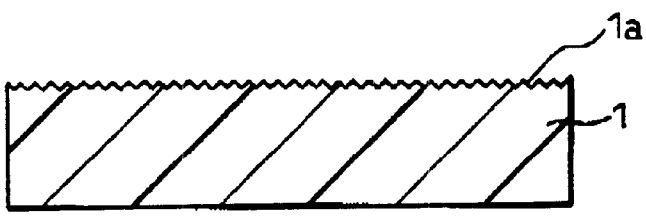

Then, as shown in the step of FIG. 7B, a topographic pattern 1a is provided on a surface of the core substrate 1. The topographic pattern can be advantageously formed, for example, by laser fabrication at a desired pattern and etching depth, The etching depth is usually in a range from about 5 to 50 $\mu$m.

Figure 7C:
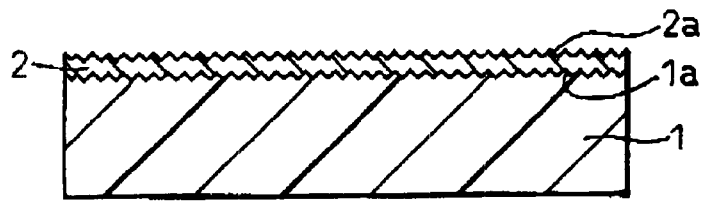
Figure 7D:
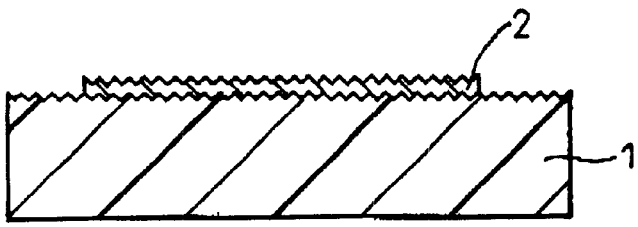

After the topographic pattern has been formed, copper is plated on the core substrate by an electroless plating or an electrolytic plating. The plating method may be a conventional one. As shown in the step of FIG. 7C, a copper layer 2 (of about 10 $\mu$m thick) is formed over a full surface of the core substrate 1. A topographic pattern 2a is transferred to a surface of the copper layer 2 in correspondence to the topographic pattern 1a of the underlying core substrate 1. Subsequently, the copper layer thus formed is patterned by a conventional technique to remove the unnecessary portions thereof. As shown in the step of FIG. 7D, the core substrate 1 having a copper wiring layer 2 is obtained. The copper wiring layer 2 may be subjected, for example, to a so-called "soft etching" process or an electrolytic polishing process for the control of the topographic pattern 2a on the surface thereof. The copper wiring layer 2 corresponds to the lower wiring layer referred to in the present invention.

Figure 7E:
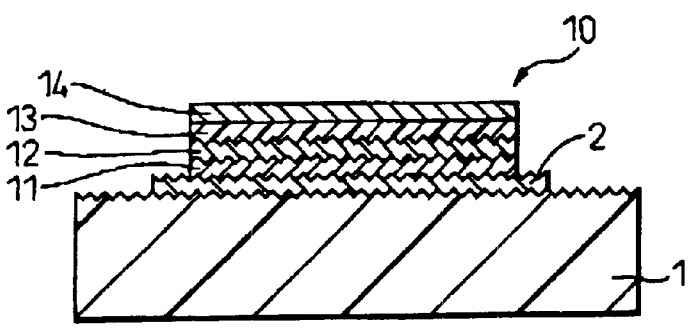

After the copper wiring layer 2 has been formed, the capacitor of the present invention is formed thereon. The completed capacitor 10 is shown in FIG. 7E. The capacitor 10 is formed as follows.

First, a lower electrode (lower metallic layer) 11 is formed. The lower electrode 11 can be formed by sputtering 1a while covering an area of the core substrate 1 other than that corresponding to the electrode with a mask of a photoresist. A film thickness of the lower electrode 11 is usually in a range from about 2 to 3 $\mu$m. The topographic pattern derived from the copper wiring layer 2 is also formed on the surface of the lower electrode 11.

Subsequently, the Ta layer for the lower electrode 11 is anodized in a conventional method to form an anodized film (a $Ta_2O_5$ layer) of several Å thick as a dielectric layer 12. The anodizing process can be carried out by preparing a 0.1% solution of sodium citrate as an electrolytic liquid and connecting the core substrate 1 having the Ta layer with an anode wherein a current is maintained at 10 mA/cm$^2$ until the oxidation reaction voltage reaches 200 V. In this step, as the photoresist applied as a mask becomes unnecessary after the anodizing has finished, it may be removed either at this stage, or after completion of the capacitor 10.

After formation of the dielectric layer 12, an intermediate layer 13 of a solid electrolyte, about 1 to 2 $\mu$m thick is formed thereon. As the solid electrolyte, a conductive polymer, an organic semiconductor or a conductive metal oxide may be used. Depending on kinds of the solid electrolyte used, an optimum film-forming method can be selected and used. For example, the conductive metal oxide such as tin oxide can be formed by vacuum deposition (chemical vapor deposition) or the like.

Finally, an upper electrode (upper metallic layer) 14 is formed. The upper electrode 14 can be formed by sputtering an electrode metal such as Au or Cu. A film thickness of the upper electrode 14 is usually in a range from about 2 to 3 $\mu$m. On a surface of the upper electrode 14, no topographic pattern derived from the copper wiring layer 2 is reproduced.

Figure 7F:
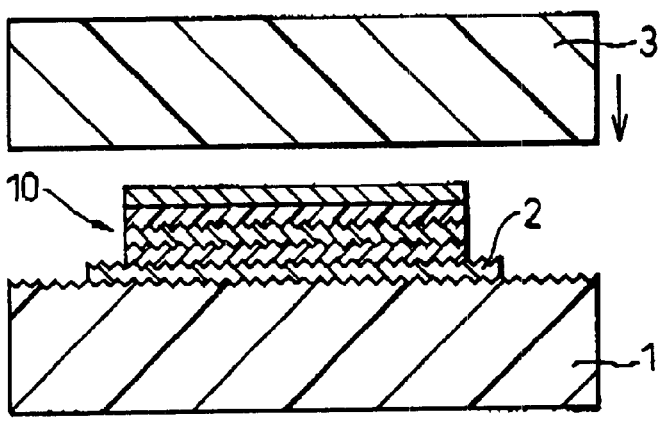
Figure 7G:
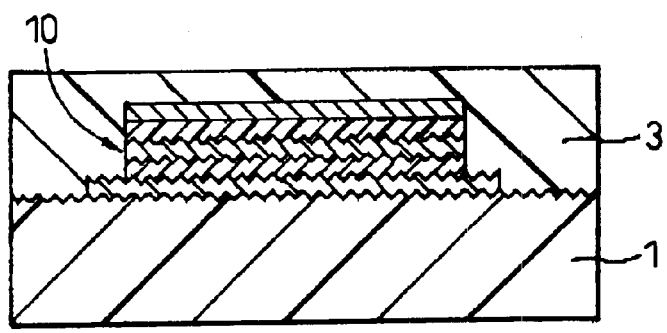

After completion of the capacitor 10 through the above-mentioned series of processes, an insulation film 3 is formed by coating an epoxy resin, or adhering an epoxy film, onto the capacitor 10 as shown in the step of FIG. 7F. The capacitor 10 is sealed with the insulation film 3, as a whole, as shown in the step of FIG. 7G.

Figure 7H:
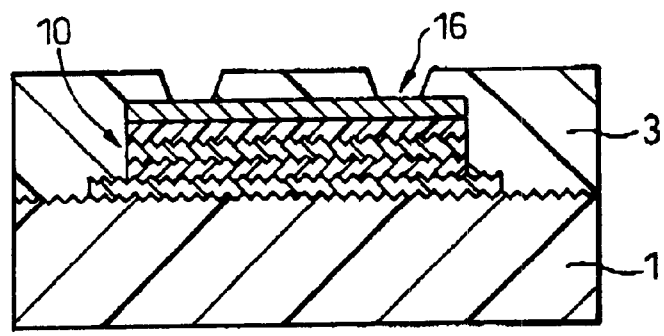
Figure 7I:
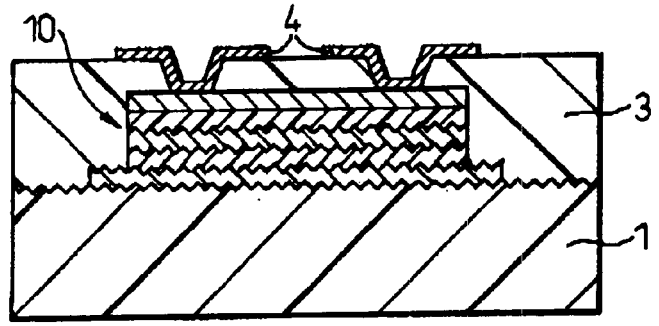

Next, as shown in the step of FIG. 7H, the insulation film 3 is subjected to a laser fabrication to form two vias 16 for ensuring the conductivity of the capacitor 10. Then a copper film is provided, by copper plating, and is patterned to form a copper wiring layer 4, as shown in FIG. 7I.

While the above-mentioned series of processes is an preferred example of a method for producing the capacitors 10 shown in the process of FIG. 3D or FIG. 5, the capacitors 10 shown in FIGS. 4 and 6 and any other capacitors (not shown) can be produced in a similar manner.

As described hereinbefore, according to the present invention, it becomes possible to provide a capacitor having a large electrostatic capacity, a high resistance to voltage and a low leakage current.

Further, according to the present invention, as the number of elements to be mounted is not limited and a distance between a semiconductor chip to the capacitor can be minimized when the capacitor is mounted onto a semiconductor package, a capacitor which contributes to the minimization of a size or the high density arrangement of a semiconductor package can be provided.

Furthermore, according to the present invention, it becomes possible to provide a small and high-performance circuit board in which at least one capacitor of the present invention is incorporated.

In addition, according to the present invention, it becomes possible to provide a method for producing a capacitor and a circuit board with a built-in capacitor with high reliability and a good production yield.

What is claimed is:

1. A capacitor to be disposed between a lower wiring layer and an upper wiring layer in an interior of a circuit board, which comprises a lower metallic layer consisting of at least one valve metal selected from the group consisting of aluminum, tantalum, niobium, tungsten, vanadium, bismuth, titanium, zirconium and hafnium, a dielectric layer consisting of an oxide of the valve metal which is the same as or different from that of the lower metallic layer, an intermediate layer consisting of a solid electrolyte, and an upper metallic layer consisting of an electrode metal, laminated in this order, and in which the intermediate layer comprises a conductive polymer, an organic semiconductor material deposited in a dry process or a conductive metal oxide deposited in a dry process.

2. A capacitor as defined in claim 1, wherein the dielectric layer comprises a metal oxide formed upon anodizing of the lower metallic layer or upon forming a film with a film-forming material.

3. A capacitor as defined in claim 1 or 2, wherein the lower wiring layer has a topographic pattern on a surface thereof, the pattern being reproduced in the lower metallic layer and the dielectric layer formed thereon.

4. A capacitor as defined in claim 3, wherein a surface roughness of the topographic pattern in the lower metallic layer is in a range from 5 to 50 $\mu$m as measured in a vertical distance between a top of the projections and a bottom of the pits in the layer.

5. A circuit board with a built-in capacitor wherein a capacitor is sandwiched between a lower wiring layer and an upper wiring layer in the interior of the circuit board, the capacitor comprising a lower metallic layer consisting of at least one valve metal selected from the group consisting of aluminum, tantalum, niobium, tungsten, vanadium, bismuth, titanium, zirconium and hafnium, a dielectric layer consisting of an oxide of the valve metal which is the same as or different from that of the lower metallic layer, an intermediate layer consisting of a solid electrolyte, and an upper metallic layer consisting of an electrode metal, are laminated in this order, and in which the intermediate layer comprises a conductive polymer, an organic semiconductor material deposited in a dry process or a conductive metal oxide deposited in a dry process.

6. A circuit board as defined in claim 5, wherein the dielectric layer comprises a metal oxide formed upon an anodizing of the lower metallic layer or upon forming a film with a film-forming material.

7. A circuit board as defined in claim 5 or 6, wherein the lower wiring layer has a topographic pattern on a surface thereof, the pattern being reproduced in the lower metallic layer and in the dielectric layer formed thereon.

8. A circuit board as defined in claim 7, wherein a surface roughness of the topographic pattern in the lower metallic layer is in a range from 5 to 50 $\mu$m as measured over a vertical distance between a top of projections and a bottom of pits in the layer.

9. A circuit board as defined in claim 5 or 6, wherein the circuit board is a multi-layered circuit board having a built-up structure.

10. A method for producing a capacitor to be disposed between a lower wiring layer and an upper wiring layer, in an interior of a circuit board, which method comprises the steps of, after formation of the lower wiring layer:

forming a lower metallic layer, on the lower wiring layer, from at least one valve metal selected from the group consisting of aluminum, tantalum, niobium, tungsten, vanadium, bismuth, titanium, zirconium and hafnium;

forming a dielectric layer, on the lower metallic layer, from an oxide of the valve metal which is the same as or different from that of the lower metallic layer;

forming an intermediate layer, on the dielectric layer, from a solid electrolyte selected from the group consisting of a conductive polymer, organic semiconductor material and conductive metal oxide with the proviso that the organic semiconductor material or the conductive metal oxide is deposited in a dry process; and forming an upper metallic layer, on the intermediate layer, from an electrode metal.

11. A method for producing a capacitor as defined in claim 10, wherein the dielectric layer comprises a metal oxide formed upon an anodizing of the lower metallic layer or upon forming a film with a film-forming material.

12. A method for producing a capacitor as defined in claim 10 or 11, further comprising the step of roughening a surface of the lower wiring layer after formation of the wiring layer to thereby impart a topographic pattern to the lower metallic layer and the dielectric layer sequentially formed thereon, in addition to the wiring layer.

13. A method for producing a capacitor as defined in claim 12, wherein a surface roughness of the topographic pattern in the lower metallic layer is controlled to be in a range from 5 to 50 μm as measured over a vertical distance between a top of projections and a bottom of pits.

14. A method for producing a circuit board with a built-in capacitor wherein a capacitor is sandwiched between a lower wiring layer an upper wiring layer in an interior of the circuit board, which method comprises the steps of:

after formation of the lower wiring layer consisting of a conductive metal on a core substrate;

forming a lower metallic layer, on the lower wiring layer, from at least one valve metal selected from the group consisting of aluminum, tantalum, niobium, tungsten, vanadium, bismuth, titanium, zirconium and hafnium;

forming a dielectric layer, on the lower metallic layer, from an oxide of the valve metal which is the same as or different from that of the lower metallic layer;

forming an intermediate layer, on the dielectric layer, from a solid electrolyte selected from the group consisting of a conductive polymer, organic semiconductor material and conductive metal oxide with the proviso that the organic semiconductor material or the conductive metal oxide is deposited in a dry process;

forming an upper metallic layer, on the intermediate layer, from an electrode metal; and further forming the upper wiring layer consisting of a conductive metal on the thus formed capacitor.

15. A method for producing a circuit board as defined in claim 14, wherein the dielectric layer comprises a metal oxide formed upon anodizing of the lower metallic layer or upon forming a film with a film-forming material.

16. A method for producing a circuit board as defined in claim 14 or 15, further comprising the step of roughening a surface of the core substrate to thereby impart a topographic pattern to the lower wiring layer, the lower metallic layer and the dielectric layer sequentially formed thereon, in addition to the core substrate.

17. A method for producing a circuit board as defined in claim 14 or 15, further comprising, after formation of the lower wiring layer on the core substrate, the step of roughening a surface of the lower wiring layer to impart to a surface of the wiring layer a topographic pattern which is then reproduced in the lower metallic layer and the dielectric layer sequentially formed thereon.

18. A method for producing a circuit board as defined in claim 16, wherein a surface roughness of the topographic pattern in the lower metallic layer is controlled to be in a range from 5 to 50 μm as measured by a vertical distance between a top of projections and a bottom of pits.

19. A method for producing a circuit board as defined in claim 14, further comprising, after formation of the capacitor on the core substrate, the steps of forming an insulation film covering the capacitor and then forming a second capacitor on the insulation film in the same manner as in the formation of the above capacitor.

20. A capacitor to be disposed between a lower wiring layer and an upper wiring layer in an interior of a circuit board, which comprises a lower metallic layer consisting of at least one valve metal selected from the group consisting of aluminum, tantalum, niobium, tungsten, vanadium, bismuth, titanium, zirconium and hafnium, a dielectric layer consisting of an oxide of the valve metal which is the same as or different from that of the lower metallic layer, an intermediate layer consisting of a solid electrolyte, and an upper metallic layer consisting of an electrode metal, laminated in this order, and in which the dielectric layer comprises a metal oxide formed upon anodizing of the lower metallic layer or upon forming a film with a film-forming material.

21. A capacitor as defined in claim 20, wherein the intermediate layer comprises a conductive polymer, an organic semiconductor material or a conductive metal oxide.

22. A capacitor as defined in claim 20, wherein the lower wiring layer has a topographic pattern on a surface thereof, the pattern being reproduced in the lower metallic layer and the dielectric layer formed thereon.

23. A capacitor as defined in claim 22, wherein a surface roughness of the topographic pattern in the lower metallic layer is in a range from 5 to 50 μm as measured in a vertical distance between a top of the projections and a bottom of the pits in the layer.

24. A circuit board with a built-in capacitor wherein a capacitor is sandwiched between a lower wiring layer and an upper wiring layer in the interior of the circuit board, the capacitor comprising a lower metallic layer consisting of at least one valve metal selected from the group consisting of aluminum, tantalum, niobium, tungsten, vanadium, bismuth, titanium, zirconium and hafnium, a dielectric layer consisting of an oxide of the valve metal which is the same as or different from that of the lower metallic layer, an intermediate layer consisting of a solid electrolyte, and an upper metallic layer consisting of an electrode metal, are laminated in this order, and in which the dielectric layer comprises a metal oxide formed upon an anodizing of the lower metallic layer or upon forming a film with a film-forming material.

25. A circuit board as defined in claim 24, wherein the intermediate layer comprises a conductive polymer, organic semiconductor material or conductive metal oxide.

26. A circuit board as defined in claim 24, wherein the lower wiring layer has a topographic pattern on a surface thereof, the pattern being reproduced in the lower metallic layer and in the dielectric layer formed thereon.

27. A circuit board as defined in claim 26, wherein a surface roughness of the topographic pattern in the lower metallic layer is in a range from 5 to 50 μm as measured over a vertical distance between a top of projections and a bottom of pits in the layer.

28. A circuit board as defined in claim 24, wherein the circuit board is a multi-layered circuit board having a built-up structure.

29. A method for producing a capacitor to be disposed between a lower wiring layer and an upper wiring layer, in an interior of a circuit board, which method comprises the steps of, after formation of the lower wiring layer:

forming a lower metallic layer, on the lower wiring layer, from at least one valve metal selected from the group consisting of aluminum, tantalum, niobium, tungsten, vanadium, bismuth, titanium, zirconium and hafnium;

forming a dielectric layer, on the lower metallic layer, from an oxide of the valve metal which is the same as or different from that of the lower metallic layer;

forming an intermediate layer, on the dielectric layer, from a solid electrolyte selected from the group consisting of a conductive polymer, organic semiconductor material and conductive metal oxide; and forming an upper metallic layer, on the intermediate layer, from an electrode metal, and wherein the dielectric layer comprises a metal oxide formed upon an anodizing of the lower metallic layer or upon forming a film with a film-forming material.

30. A method for producing a capacitor as defined in claim 29, further comprising the step of roughening a surface of the lower wiring layer after formation of the wiring layer to thereby impart a topographic pattern to the lower metallic layer and the dielectric layer sequentially formed thereon, in addition to the wiring layer.

31. A method for producing a capacitor as defined in claim 30, wherein a surface roughness of the topographic pattern in the lower metallic layer is controlled to be in a range from 5 to 50 μm as measured over a vertical distance between a top of projections and a bottom of pits.

32. A method for producing a circuit board with a built-in capacitor wherein a capacitor is sandwiched between a lower wiring layer and an upper wiring layer in an interior of the circuit board, which method comprises the steps of:

after formation of the lower wiring layer consisting of a conductive metal on a core substrate;

forming a lower metallic layer, on the lower wiring layer, from at least one valve metal selected from the group consisting of aluminum, tantalum, niobium, tungsten, vanadium, bismuth, titanium, zirconium and hafnium;

forming a dielectric layer, on the lower metallic layer, from an oxide of the valve metal which is the same as or different from that of the lower metallic layer;

forming an intermediate layer, on the dielectric layer, from a solid electrolyte selected from the group consisting of a conductive polymer, organic semiconductor material and conductive metal oxide;

forming an upper metallic layer, on the intermediate layer, from an electrode metal; and further forming the upper wiring layer consisting of a conductive metal on the thus formed capacitor, and wherein the dielectric layer comprises a metal oxide formed upon anodizing of the lower metallic layer or upon forming a film with a film-forming material.

33. A method for producing a circuit board as defined in claim 32, further comprising the step of roughening a surface of the core substrate to thereby impart a topographic pattern to the lower wiring layer, the lower metallic layer and the dielectric layer sequentially formed thereon, in addition to the core substrate.

34. A method for producing a circuit board as defined in claim 32, further comprising, after formation of the lower wiring layer on the core substrate, the step of roughening a surface of the lower wiring layer to impart to a surface of the wiring layer a topographic pattern which is then reproduced in the lower metallic layer and the dielectric layer sequentially formed thereon.

35. A method for producing a circuit board as defined in claim 33 or 34, wherein a surface roughness of the topographic pattern in the lower metallic layer is controlled to be in a range from 5 to 50 μm as measured by a vertical distance between a top of projections and a bottom of pits.

36. A method for producing a circuit board as defined in claim 32, further comprising, after formation of the capacitor on the core substrate, the steps of forming an insulation film covering the capacitor and then forming a second capacitor on the insulation film in the same manner as in the formation of the above capacitor.

* * * * *